United States Patent
Parthasarathy et al.

(10) Patent No.: US 9,065,483 B2
(45) Date of Patent: Jun. 23, 2015

(54) DETERMINING SOFT DATA USING A CLASSIFICATION CODE

(71) Applicant: Micron Technology, Inc., Boise, ID (US)

(72) Inventors: Sivagnanam Parthasarathy, Carlsbad, CA (US); Patrick R. Khayat, San Diego, CA (US); Mustafa N. Kaynak, San Deigo, CA (US)

(73) Assignee: Micron Technology, Inc., Boise, ID (US)

( * ) Notice: Subject to any disclaimer, the term of this patent is extended or adjusted under 35 U.S.C. 154(b) by 63 days.

(21) Appl. No.: 13/746,195

(22) Filed: Jan. 21, 2013

(65) Prior Publication Data

US 2014/0208189 A1    Jul. 24, 2014

(51) Int. Cl.
| | |
|---|---|
| *H03M 13/00* | (2006.01) |
| *H03M 13/13* | (2006.01) |
| *H03M 13/11* | (2006.01) |
| *H03M 13/29* | (2006.01) |
| *H03M 13/45* | (2006.01) |
| *G06F 11/10* | (2006.01) |

(52) U.S. Cl.
CPC .......... *H03M 13/13* (2013.01); *H03M 13/1102* (2013.01); *H03M 13/2906* (2013.01); *H03M 13/45* (2013.01); *G06F 11/1012* (2013.01)

(58) Field of Classification Search
CPC .................................................. H03M 13/1151
USPC ......................................... 714/752, 780, 755
See application file for complete search history.

(56) References Cited

U.S. PATENT DOCUMENTS

| | | | |
|---|---|---|---|
| 6,587,372 | B2 | 7/2003 | Blodgett |
| 7,071,849 | B2 | 7/2006 | Zhang |
| 7,502,254 | B2 | 3/2009 | Murin et al. |
| 7,656,707 | B2 | 2/2010 | Kozlov |
| 7,814,401 | B2 | 10/2010 | Alrod et al. |
| 7,848,142 | B2 | 12/2010 | Radke |
| 8,031,529 | B2 | 10/2011 | Sarin |
| 8,059,763 | B1 | 11/2011 | Varnica et al. |
| 8,065,583 | B2 | 11/2011 | Radke |
| 8,086,945 | B1 * | 12/2011 | Xu et al. .............. 714/801 |
| 8,125,826 | B2 | 2/2012 | Radke |

(Continued)

FOREIGN PATENT DOCUMENTS

| | | |
|---|---|---|
| WO | 2008042593 | 4/2008 |
| WO | 2011113034 A2 | 8/2012 |

OTHER PUBLICATIONS

International Search Report and Written Opinion for related PCT Application No. PCT/US2013/074972, dated Apr. 7, 2014, 13 pages.

(Continued)

*Primary Examiner* — Esaw Abraham
(74) *Attorney, Agent, or Firm* — Brooks, Cameron & Huebsch, PLLC

(57) ABSTRACT

Apparatuses and methods for determining soft data using a classification code are provided. One example apparatus can include a classification code (CC) decoder and an outer code decoder coupled to the CC decoder. The CC decoder is configured to receive a CC codeword. The CC codeword includes a piece of an outer code codeword and corresponding CC parity digits. The CC decoder is configured to determine soft data associated with the piece of the outer code codeword, at least partially, using the corresponding CC digits.

41 Claims, 4 Drawing Sheets

(56) References Cited

U.S. PATENT DOCUMENTS

| | | |
|---|---|---|
| 8,166,379 B1 | 4/2012 | Wu et al. |
| 8,230,296 B2 * | 7/2012 | Belogolovy et al. ........... 714/755 |
| 8,243,511 B2 | 8/2012 | Patapoutian et al. |
| 8,255,764 B1 * | 8/2012 | Yeo et al. ...................... 714/758 |
| 8,255,765 B1 * | 8/2012 | Yeo et al. ...................... 714/758 |
| 8,321,769 B1 | 11/2012 | Yeo et al. |
| 8,335,977 B2 * | 12/2012 | Weingarten et al. .......... 714/794 |
| 8,458,573 B1 * | 6/2013 | Wu et al. ....................... 714/780 |
| 8,589,765 B1 * | 11/2013 | Scheppler et al. ............. 714/763 |
| 8,621,316 B2 * | 12/2013 | Miyata et al. ................. 714/755 |
| 8,621,318 B1 * | 12/2013 | Micheloni et al. ............. 714/755 |
| 8,627,188 B2 * | 1/2014 | Weingarten et al. .......... 714/794 |
| 2008/0052564 A1 | 2/2008 | Yim et al. |
| 2009/0109747 A1 | 4/2009 | Radke |
| 2010/0034018 A1 | 2/2010 | Yang et al. |
| 2010/0088575 A1 | 4/2010 | Sharon et al. |
| 2010/0157641 A1 | 6/2010 | Shalvi et al. |
| 2010/0220514 A1 | 9/2010 | Vigoda et al. |
| 2011/0058424 A1 | 3/2011 | Goda et al. |
| 2011/0093652 A1 | 4/2011 | Sharon et al. |
| 2011/0167305 A1 | 7/2011 | Haratsch et al. |
| 2011/0209031 A1 | 8/2011 | Kim et al. |
| 2011/0214029 A1 | 9/2011 | Steiner et al. |
| 2011/0246855 A1 | 10/2011 | Cheng et al. |
| 2011/0246859 A1 | 10/2011 | Haratsch et al. |
| 2012/0198314 A1 | 8/2012 | Yang et al. |
| 2012/0236638 A1 | 9/2012 | Weingarten et al. |
| 2012/0240007 A1 | 9/2012 | Barndt et al. |

OTHER PUBLICATIONS

Lou, et al., "Increasing Storage Capacity in Multilevel Memory Cells by Means of Communications and Signal Processing Techniques," Abstract 1 pg., Aug. 2000, vol. 147, Issue 4, Circuits, Devices and Systems, IEE Proceedings.

U.S. Appl. No. 12/889,372, entitled "Phase Change Memory State Determination Using Threshold Edge Detection," filed Sep. 23, 2010, (29 pgs.).

U.S. Appl. No. 13/435,243, entitled "Encoding Program Bits to Decouple Adjacent Worldlines in a Memory Device," filed Mar. 30, 2012, (24 pgs.).

U.S. Appl. No. 13/474,609, entitled "Program-Disturb Management for Phase Change Memory," filed May 17, 2012, (30 pgs.).

U.S. Appl. No. 13/691,266, entitled "Determining Soft Data From a Hard Read," filed Nov. 30, 2012, (54 pgs.).

U.S. Appl. No. 13/444,314, entitled "Mapping Between Program States and Data Patterns," filed Apr. 11, 2012, (44 pgs.).

U.S. Appl. No. 13/746,181, entitled "Determining Soft Data for Fractional Digit Memory Cells," filed Jan. 21, 2013, (55 pgs.).

* cited by examiner

DETERMINING SOFT DATA USING A CLASSIFICATION CODE

TECHNICAL FIELD

The present disclosure relates generally to memory error correction, and more particularly, to apparatuses and methods for determining soft data using a classification code.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, phase change random access memory (PCRAM), resistive random access memory (RRAM), and magnetic random access memory (MRAM), among others.

Memory devices can be combined together to form a solid state drive (SSD). An SSD can include non-volatile memory, e.g., NAND flash memory and/or NOR flash memory, and/or can include volatile memory, e.g., DRAM and/or SRAM, among various other types of non-volatile and volatile memory. Flash memory devices can include memory cells storing information in a charge storage structure such as a floating gate, for instance, and may be utilized as non-volatile memory for a wide range of electronic applications.

Memory is utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

A hard read is a read operation to distinguish between the multiple states to which a memory cell may be programmed. A hard read returns hard data, e.g., a digit corresponding to the state determined by the read operation. Soft data can be data other than hard data. Soft data can indicate (or be used to indicate) a confidence level regarding confidence associated with the hard data. For example, a soft read can be used to determine the particular voltage to which a memory cell is charged, which can be used to characterize the reliability of the hard data. The reliability of hard data may be less for a memory cell charged to a particular voltage near a boundary between two states, than for a memory cell charged to a particular voltage near the center of a voltage range corresponding to a state. Various error-correcting code schemes can perform much better using soft data. However, soft data determined by a soft read is slower compared to a hard read, and communicating soft data determined by a soft read can consume bandwidth and impact memory throughput.

DETAILED DESCRIPTION

Apparatuses and methods for determining soft data using a classification code are provided. One example apparatus can include a classification code (CC) decoder and outer code decoder (corresponding to one or more codes other than the CC) coupled to the CC decoder. The CC can be an innermost code, and there can be one or more outer error correction code(s) (ECC), such as a low density parity check (LDPC) code. The CC decoder is configured to receive a CC codeword. The CC codeword includes a piece of the outer ECC codeword. The CC decoder is configured to determine soft data associated with the piece of the outer ECC codeword based, at least partially, on the corresponding CC parity digits, e.g., parity bits.

According to various embodiments of the present disclosure, a "classification code" is used to generate soft data based on data obtained from a hard read from a memory, e.g., Flash memory. The soft data generated in this manner can be used in an iterative decoder, e.g., an LDPC decoder. The classification code can be utilized with simple and straight forward encoding and decoding techniques, and its use can provide best raw bit error rate (RBER) performance in certain iteration ranges, as compared to prior approaches. One advantage of the apparatuses and methods of the present disclosure is the use of a classification code to generate soft data based on the hard reads from the memory, which can be achieved using only a small portion of the ECC overhead. The classification code of the present disclosure can be used in cooperation with LDPC codes as well as any ECC whose decoder can utilize any form of soft information.

Advantages of LDPC codes can include near Shannon capacity performance and efficient/structural hardware implementation. LDPC decoders utilize a "belief propagation" algorithm, which is based on the iterative exchange of reliability information, e.g., "beliefs." An LDPC decoder is probabilistic in nature; therefore, it can utilize soft data. In fact, LDPC codes can only achieve near Shannon capacity performance in the presence of soft data, e.g., reliability value.

However, working with soft data read from the memory involves several challenges, including but not limited to, obtaining the soft data via soft reads of the memory which can require multiple reads and result in slower read time compared to hard reads. Transferring soft data read from the memory can result in lower throughput rates compared to transferring hard read data because multiple bits are transferred instead of a single bit for the hard read case. Calculating soft read positions that will include all pages/blocks/dies in a memory can be difficult. Therefore, it can be more efficient to operate the flash device in the hard read mode as much as possible.

Figure 1:
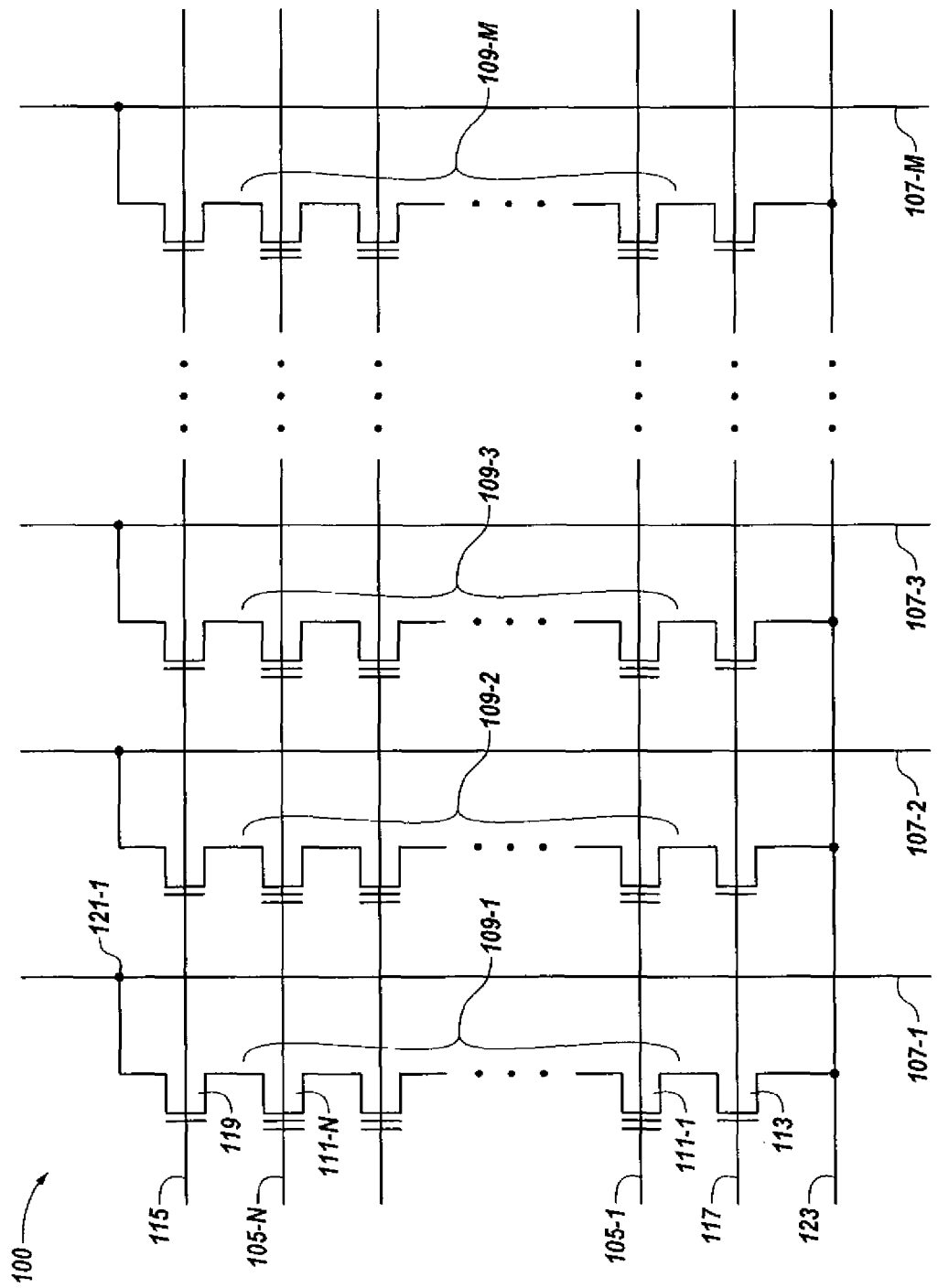
FIG. 1 illustrates a schematic diagram of a portion of a non-volatile memory array in accordance with a number of embodiments of the present disclosure.

FIG. 1 illustrates a schematic diagram of a portion of a non-volatile memory array 100 in accordance with a number of embodiments of the present disclosure. The embodiment of FIG. 1 illustrates a NAND architecture non-volatile memory array, e.g., NAND Flash. However, embodiments described herein are not limited to this example. As shown in FIG. 1, memory array 100 includes access lines, e.g., word lines 105-1, ..., 105-N, and intersecting data lines, e.g., local bit lines, 107-1, 107-2, 107-3, ..., 107-M. For ease of addressing in the digital environment, the number of word lines 105-1, ..., 105-N and the number of local bit lines 107-1, 107-2, 107-3, ..., 107-M can be some power of two, e.g., 256 word lines by 4,096 bit lines.

Memory array 100 includes NAND strings 109-1, 109-2, 109-3, ..., 109-M. Each NAND string includes non-volatile memory cells 111-1, ..., 111-N, each coupled to a respective word line 105-1, ..., 105-N. Each NAND string (and its constituent memory cells) is also associated with a local bit line 107-1, 107-2, 107-3, ..., 107-M. The non-volatile memory cells 111-1, ..., 111-N of each NAND string 109-1, 109-2, 109-3, ..., 109-M are connected in series source to drain between a source select gate (SGS), e.g., a field-effect transistor (FET), 113, and a drain select gate (SGD), e.g., FET, 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N, e.g., a floating-gate transistor, of the corresponding NAND string 109-1.

In a number of embodiments, construction of non-volatile memory cells 111-1, ..., 111-N includes a source, a drain, a charge storage structure such as a floating gate, and a control gate. Non-volatile memory cells 111-1, ..., 111-N have their control gates coupled to a word line, 105-1, ..., 105-N respectively. A "column" of the non-volatile memory cells, 111-1, ..., 111-N, make up the NAND strings 109-1, 109-2, 109-3, ..., 109-M, and are coupled to a given local bit line 107-1, 107-2, 107-3, ..., 107-M, respectively. A "row" of the non-volatile memory cells are those memory cells commonly coupled to a given word line 105-1, ..., 105-N. The use of the terms "column" and "row" is not meant to imply a particular linear, e.g., vertical and/or horizontal, orientation of the non-volatile memory cells. A NOR array architecture can be similarly laid out, except that the string of memory cells is coupled in parallel between the select gates.

Subsets of cells coupled to a selected word line, e.g., 105-1, ..., 105-N, can be programmed and/or read together as a page of memory cells. A programming operation, e.g., a write operation, can include applying a number of program pulses, e.g., 16V-20V, to a selected word line in order to increase the threshold voltage (Vt) of selected cells coupled to that selected access line to a desired program voltage level corresponding to a target, e.g., desired, state, e.g., charge storage state.

A read operation (as used herein, a "read" operation can refer to a program verify operation) can include sensing a voltage and/or current change of a bit line coupled to a selected cell in order to determine the data value of the selected cell. The read operation can include pre-charging a bit line and sensing the discharge when a selected cell begins to conduct. As used herein, sensing is an act involved in reading.

Determining, e.g., sensing, the state of a selected cell can include providing a number of sensing signals, e.g., read voltages, to a selected word line while providing a number of voltages, e.g., read pass voltages, to the word lines coupled to the unselected cells of the string sufficient to place the unselected cells in a conducting state independent of the threshold voltage of the unselected cells. The bit line corresponding to the selected cell being read and/or verified can be sensed to determine whether or not the selected cell conducts in response to the particular sensing signal applied to the selected word line. For example, the state of a selected cell can be determined by the word line voltage at which the bit line current reaches a particular reference current associated with a particular state.

In a sensing operation performed on a selected memory cell in a NAND string, the unselected memory cells of the string are biased so as to be in a conducting state. In such a sensing operation, the state of the selected cell can be determined based on the current and/or voltage sensed on the bit line corresponding to the string. For instance, the state of the selected cell can be determined based on whether the bit line current changes by a particular amount or reaches a particular level in a given time period.

As an example, the memory cells of an array, such as array 100 shown in FIG. 1, can be single level (memory) cells (SLCs) or multi-level (memory) cells (MLCs). SLCs can be single-bit, e.g., two-state, memory cells. That is, the cells can be programmed to one of two states, e.g., P0 and P1, respectively. In operation, a number of memory cells, such as in a selected block, can be programmed such that they have a Vt level corresponding to either P0 or P1. As an example, state P0 can represent a stored data value such as binary "1." State P1 can represent a stored data value such as binary "0."

MLCs can be two-bit, e.g., four-state, memory cells, or can store more than two bits of data per memory cell, including fractional bits of data per memory cell. For example, a two-bit memory cell can be programmed to one of four states, e.g., P0, P1, P2, and P3, respectively. In operation, a number of memory cells, such as in a selected block, can be programmed such that they have a Vt level corresponding to either P0, P1, P2, or P3. As an example, state P0 can represent a stored data value such as binary "11." State P1 can represent a stored data value such as binary "10." State P2 can represent a stored data value such as binary "00." State P3 can represent a stored data value such as binary "01." However, embodiments are not limited to these examples.

Figure 2:
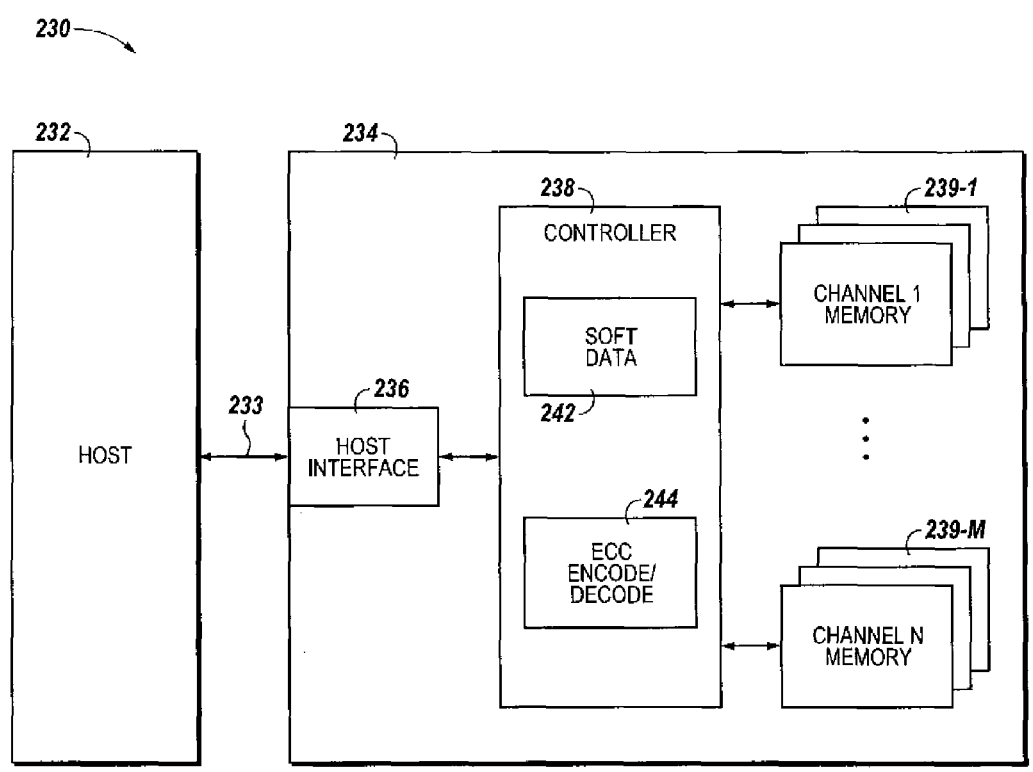
FIG. 2 is a block diagram of an apparatus in the form of a computing system including at least one memory system in accordance with a number of embodiments of the present disclosure.

FIG. 2 is a block diagram of an apparatus in the form of a computing system 230 including at least one memory system 234 in accordance a number of embodiments of the present disclosure. As used herein, a memory system 234, a controller 238, or a memory device 239 might also be separately considered an "apparatus." The memory system 234 can be a solid state drive (SSD), for instance, and can include a host interface 236, a controller 238, e.g., a processor and/or other control circuitry, and a number of memory devices 239-1, ..., 239-M, e.g., solid state memory devices such as NAND flash devices, which provide a storage volume for the memory system 234. In a number of embodiments, the controller 238, a memory device 239-1 to 239-M, and/or the host interface 236 can be physically located on a single die or within a single package, e.g., a managed NAND application. Also, in a number of embodiments, a memory, e.g., memory devices 239-1 to 239-M, can include a single memory device.

As illustrated in FIG. 2, the controller 234 can be coupled to the host interface 236 and to the memory devices 239-1, ..., 239-M via one or more channels and can be used to transfer data between the memory system 234 and a host 232. The interface 236 can be in the form of a standardized interface. For example, when the memory system 234 is used for data storage in a computing system 230, the interface 236 can be a serial advanced technology attachment (SATA), peripheral component interconnect express (PCIe), or a universal serial bus (USB), among other connectors and interfaces. In general, however, interface 236 can provide an interface for passing control, address, data, and other signals between the memory system 234 and a host 232 having compatible receptors for the host interface 236.

Host 232 can be a host system such as a personal laptop computer, a desktop computer, a digital camera, a mobile telephone, or a memory card reader, among various other types of hosts. Host 232 can include a system motherboard and/or backplane and can include a number of memory access devices, e.g., a number of processors. Host 232 can be coupled to the host interface 236 by a communication channel 233.

The controller 238 can communicate with the memory devices 239-1, . . . , 239-M to control data read, write, and erase operations, among other operations. The controller 238 can include, for example, a number of components in the form of hardware and/or firmware, e.g., one or more integrated circuits, and/or software for controlling access to the number of memory devices 239-1, . . . , 239-M and/or for facilitating data transfer between the host 232 and memory devices 239-1, . . . , 239-M. For instance, in the example illustrated in FIG. 2, the controller 238 can include a soft data component 242 and an error code/decode component 244. However, the controller 238 can include various other components not illustrated so as not to obscure embodiments of the present disclosure. Also, the components 242 and/or 244 may not be components of controller 238 in some embodiments, e.g., the components 242 and/or 244 can be independent components.

The soft data component 242 can be used to determine, e.g., look-up, soft data. For example, the soft data component 242 can be used to determine soft data from a hard read. The error code/decode component 244 can be a BCH encoder/decoder, an LDPC encoder/decoder, a classification code encoder/decoder, and/or other type of encoder/decoder for instance, which can encode/decode user data transferred between host 232 and the memory devices 239-1, . . . , 239-M. The soft data component 242 can be coupled to the error code/decode component 244, for example, to provide soft data thereto. Additionally, a decoder of the error code/decode component 244 can provide soft data to another decoder of the error code/decode component 244.

The memory devices 239-1, . . . , 239-M can include a number of arrays of memory cells, e.g., arrays such as array 100 shown in FIG. 1. The arrays can be flash arrays with a NAND architecture, for example. However, embodiments are not limited to a particular type of memory array or array architecture. The memory cells can be grouped, for instance, into a number of blocks including a number of physical pages. A number of blocks can be included in a plane of memory cells and an array can include a number of planes.

Figure 3:
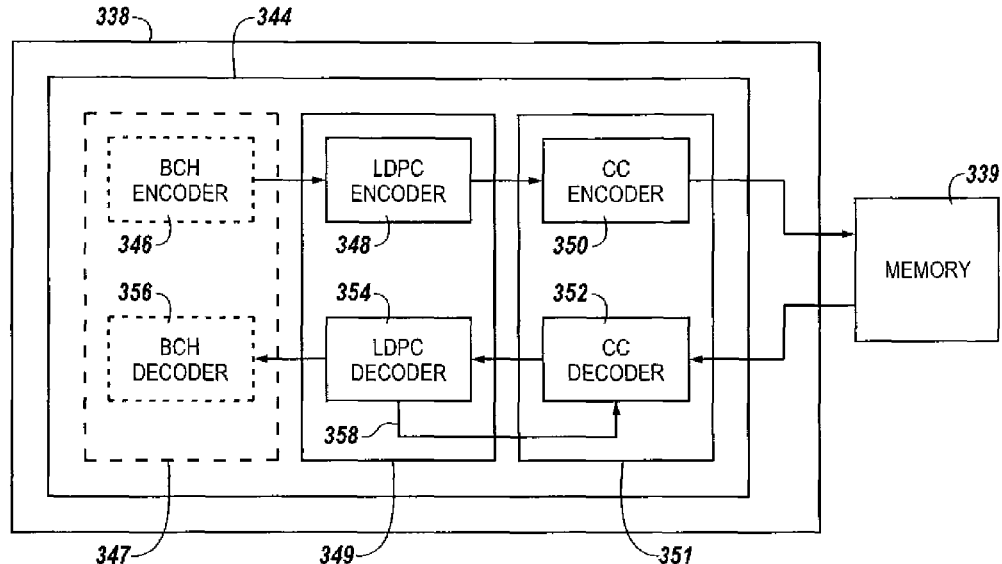
FIG. 3 is a functional block diagram of an apparatus in the form of a controller in accordance with a number of embodiments of the present disclosure.

FIG. 3 is a functional block diagram of an apparatus in the form of a controller 338 in accordance with a number of embodiments of the present disclosure. Controller 338 can be coupled to a memory 339, and controller 338 can include an ECC encode/decode component 344. Controller 338 can be equivalent to controller 238 shown as a part of computing system 230 in FIG. 2. Although the apparatus and methods of the present disclosure are illustrated with respect to a computing system, and more particularly with respect to decoding data read from memory, embodiments of the present disclosure are not so limited and can be implemented in other manners, such as for decoding data transmitted through the communication channel 233, etc.

Memory 339 can be a non-transitory media, and include a number of arrays of memory cells, e.g., non-volatile memory cells. The arrays can be Flash arrays with a NAND architecture, such as array 100 shown in FIG. 1, for example. However, embodiments of the present disclosure are not limited to a particular type of memory array or array architecture. The methods and apparatuses of the present disclosure can also be used or implemented with other memory cells, such as memory cells typically used in, for example, DRAM, PCRAM, and/or RRAM memories.

The controller 338 can communicate with the memory 339 to operate, e.g., read, write, move, program, sense, erase, the memory cells. Thus, controller 338 can manage communications with, and the data stored in, the memory 339. The controller 338 can have circuitry utilizing a number of integrated circuits, as well as other discrete components. In a number of embodiments, the controller 338 can be an application specific integrated circuit (ASIC) coupled to a printed circuit board including the host interface 108, and/or the memory device 339. The memory 339 and/or controller 338 can include additional circuitry that is not illustrated so as not to obscure embodiments of the present disclosure. As used herein, the controller 338 and/or the memory 339 might also be implemented separately and/or considered an "apparatus."

The ECC encode/decode component 344 can include logic configured for encoding and decoding data being transmitted to and/or received from the memory 339. Encoding and/or decoding of the data can be accomplished in hardware and/or software. For example, the ECC encode/decode component 344 can receive unencoded data at an input and provide encoded data at an output.

As illustrated in FIG. 3, the ECC encode/decode component 344 can include a number of various types of error code/decode components, e.g., encoder/decoder implementing a particular ECC engine. The error coding components can be configured to encode data, e.g., user data, received, for example, from a host, e.g., 232 shown in FIG. 2, to be written to, e.g., stored in, the memory 339. According to alternative embodiment(s), the various types of error code/decode components can be implemented as components of the controller 338 rather than of an ECC encode/decode component 344.

According to a number of embodiments, ECC encode/decode component 344 can include a number of encoding portion(s) and/or decoding portion(s). For example, ECC encode/decode component 344 can include one or more outer code encoder(s), e.g., an LDPC encoder 348, one or more outer code decoders, e.g., an iterative decoder such as an LDPC decoder 354, a CC encoder 350, and a CC decoder 352. The ECC encode/decode component 344 can also include, for example, an optional Bose, Chaudhuri, and Hocquenghem (BCH) encoder 346 and BCH decoder 356. The optional BCH encoder 346 and BCH decoder 356 can be implemented as an outermost code encoder and decoder such that there is one or more intermediate code encoders, e.g., the LDPC encoder 348, and one or more intermediate code decoders, e.g., an iterative decoder such as the LDPC decoder 354. The optional BCH encoder 346 and BCH decoder 356 can be implemented as separate components, or implemented as a BCH encoder/decoder 347. LDPC encoder 348 and LDPC decoder 354 can be implemented as separate components, or may be implemented as components of an encoder/iterative decoder 349. CC encoder 350 and/or a CC decoder 352 can be implemented as separate components, or may be implemented as components of a CC encoder/decoder 351. Embodiments of the present disclosure are not limited to the particular quantities and/or types of code encoders/decoders set forth above, and can include additional encoders/decoders, and/or different types or ordering of encoding/decoding than those described above.

According to various embodiments of the present disclosure, a CC decoder 352 can be implemented in hardware as a component of a controller, or via a processor, microprocessor, system-on-a-chip, application-specific-integrated-circuit, hardware logic, or other circuitry suitable for inclusion on one or more integrated circuits providing all or portions of the disclosed functionality. In various embodiments, the CC decoder 352 can be designable and/or manufacturable according to a variety of techniques, including a programmable technique such as a field or mask programmable gate array integrated circuit, a semi-custom technique such as a wholly or partially cell-based integrated circuit, a technique such as a specialized integrated circuit, a combination thereof, or another technique compatible with design and/or manufacturing of integrated circuits.

User data can be first encoded using the optional BCH encoder 346, which can be further encoded using the LDPC encoder 348, which can be further encoded using the CC encoder 350. As such, the LDPC code is an inner code to the BCH code, and the CC is an inner code to the LDPC code. According to various embodiments, the BCH encoder 346 and/or BCH decoder 356 can be optionally omitted, as indicated in FIG. 3 by the dashed outlines.

According to various embodiments of the present disclosure, the ECC encode/decode component 344 can selectably implement an all LDPC ECC scheme or a concatenated ECC scheme which has an inner LDPC code and an outer BCH code. In the concatenated ECC scheme, LDPC decoder can run for 1 or 2 iterations, for example. The residual errors after the 1 or 2 iterations can be corrected by component(s) implementing, for example, the outer BCH code.

A precision rich LDPC decoder can be used such that the LDPC decoder can be controlled to a desired quantity of iterations. The all LDPC ECC scheme can support higher RBER performance compared to the concatenated ECC scheme, e.g., concatenation of an LDPC code with an outer/inner code, in both hard and soft modes for certain applications provided that it can run as many iterations as needed. The all LDPC ECC scheme can provide a variable throughput rate, depending on the number of LDPC decoder iterations and the available hardware resources. However, the all LDPC ECC scheme can require more decoder iterations to reach a same RBER performance compared to the concatenated ECC scheme, and utilizes a more complex ECC decode component, e.g., LDPC decoder 354. Higher decoder iterations translate to higher decoder power.

The concatenated ECC scheme, for instance with an LDPC decoder implementing 1 or 2 iterations, can be implemented with a relatively less complex ECC encode/decode component 344, can require fewer iterations, can use less power than the all LDPC ECC scheme, and can provide sustained throughput (for some applications). However, the concatenated ECC scheme does not provide as high a RBER performance compared to the all LDPC ECC scheme at RBER regions corresponding to end of life RBER after cycling and retention effects on Flash memory, for example.

According to some embodiments, for applications limited to 1 or 2 iterations of an LDPC decoder, e.g., for power and hardware constraints, the concatenated ECC scheme performs better than the all LDPC ECC scheme, and for applications that are not limited to 1 or 2 iterations of an LDPC decoder, the all LDPC ECC scheme performs better than the concatenated ECC scheme.

According to various embodiments of the present disclosure, soft data determined based on a hard read of the memory is provided to the LDPC decoder. The all LDPC ECC scheme and the concatenated ECC scheme in a hard read mode can both suffer from slower decoder convergence, which translates into higher number of decoder iterations. For a given RBER, the average iteration count of the LDPC decoder will be less in the presence of soft data. The soft data can enable the LDPC decoder to differentiate between those digits of data, e.g., bits, determined to have high reliability and those digits of data determined to have low reliability, which can translate into faster correction of those digits of data determined to have low reliability due to the probabilistic nature of the LDPC decoder. An LDPC decoder using soft data distinguishing between reliable digits of data and unreliable digits of data can provide better RBER performance and faster LDPC decoder convergence, e.g., less number of average LDPC decoder iterations.

According to various embodiments of the present disclosure, a portion of the ECC overhead is used for a "classification code" (CC) comprising CC parity digits. The CC parity digits can be used to generate soft data based on data obtained by a hard read from the memory. The generated soft data can be used in the LDPC decoder to improve the LDPC decoder performance. According to some embodiments, the quality, e.g., granularity, of the soft data can be based on the amount of ECC overhead budget that is allocated to the classification code. Even coarse soft data can lead to improved RBER results out of the LDPC decoder at certain iteration numbers. Therefore, the CC of the present disclosure can be implemented using relatively little ECC overhead to achieve improved LDPC decoder results.

According to various embodiments of the present disclosure (and referring to FIG. 3), in the write path, CC encoder 350 can receive an LDPC codeword, e.g., LDPC encoded sequence, provided by the LDPC encoder 348. The LDPC codeword can be divided into a certain number of smaller pieces that correspond to the user data for CC codeword. The CC encoder 350 can add CC parity digits to each piece of the LDPC encoded sequence. A piece of LDPC codeword with appended CC parity digits is a CC codeword. In a single LDPC codeword there can be several CC codewords. The CC codewords corresponding to an LDPC codeword is a CC encoded sequence. Alternatively stated, a CC encoded sequence can comprise a number of CC codewords, each CC codeword formed from a piece of an LDPC codeword, as is described further with respect to FIG. 4.

The CC encoder 350 output, e.g., CC codeword(s), can be written to memory 339. In other words, the CC code is an inner code to the LDPC code. As is discussed in more detail below, the CC encoding can be systematic, such that the CC encoder 352 generates a CC codeword comprising a number of CC parity digits that can be appended to pieces of the LDPC codeword. As used herein, a "codeword" refers to a sequence of digits of data that can include user data, e.g., input data, and parity digits of the respective code, for example.

In the decode path, the CC decoder 352 can receive data, such as data obtained from the memory 339 by a hard read. The data received by the CC decoder 352 can be a CC encoded sequence comprising a number of CC codewords. The CC encoded sequence received by the CC decoder 352 may, or may not, be identical to the CC encoded sequence stored in the memory 339, depending on whether digit errors have occurred or not. That is, a CC codeword received by the CC decoder 352 may, or may not, be identical to a corresponding CC codeword written to the memory 339 due to possible errors in one or more digits.

The CC decoder 352 can generate soft data associated with the respective pieces of the LDPC codeword based on the capabilities associated with the CC constraints. Pieces of the LDPC codeword and the associated soft data can be provided to the LDPC decoder 354. According to various embodiments, the CC decoder 352 does not do any correction, e.g., to the LDPC codeword pieces (of the CC codewords received from the memory). That is, the RBER at the output of CC decoder 352 is the same as the RBER from the memory.

According to some embodiments, the LDPC encoder 348 can receive user data as input, and output an LDPC codeword to the CC encoder 350. Optionally, a BCH encoder 346 can receive user data as input and output a BCH codeword to the LDPC encoder 348, e.g., as input to the LDPC encoder 348. The LDPC encoder 348 can receive the BCH codeword and generate the LDPC codeword therefrom. As such, the LDPC code is an inner code to the BCH code.

According to some embodiments, the LDPC decoder 354 can receive one or more pieces comprising the LDPC codeword and soft data associated with each piece of LDPC codeword from the CC decoder 352, and output user data determined from the LDPC codeword and soft data. The soft data associated with multiple CC codewords corresponding to an LDPC codeword can be grouped together and passed to the LDPC decoder 354, which decodes the LDPC codeword using the aggregated soft data.

Optionally, the LDPC decoder 354 can receive the one or more pieces comprising the LDPC codeword and soft data associated with respective pieces of LDPC codeword from the CC decoder 352, and output a BCH codeword to the BCH decoder 356. The BCH decoder 356 can receive the BCH codeword as input and output user data. According to some embodiments, the LDPC decoder 354 can provide reliability data to the CC decoder 352 via a feedback path 358, as is discussed further below.

According to various embodiments, the CC decoder 352 can be configured to associate a respective reliability value with various portions of the piece of the LDPC codeword, e.g., with digit(s) of the respective piece of the LDPC codeword. The reliability value can be, for example, a log-likelihood ratio (LLR). The CC decoder 352 is configured to provide the reliability value for the portions of the piece of the LDPC codeword to the LDPC decoder (along with the piece of the LDPC codeword). According to various embodiments, a reliability value can be one of three values: one value corresponding to uncertain reliability, another value corresponding to strong reliability, and a third value corresponding to weak reliability. According to some embodiments, the reliability value can be further adjusted from one of the above-mentioned three values based, at least partially, on other soft data associated with the particular digit.

Figure 4:
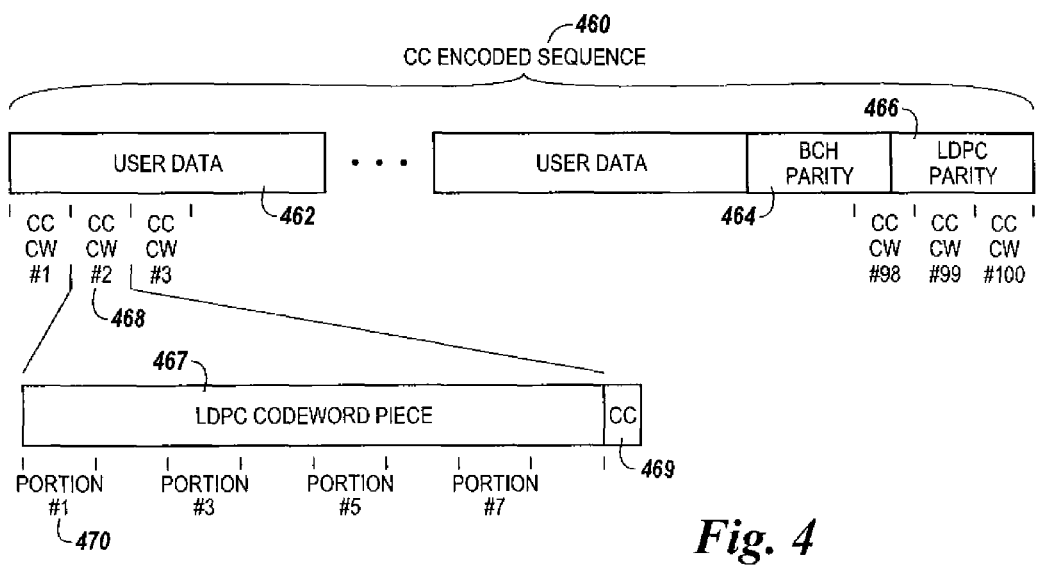
FIG. 4 is a diagram illustrating an example CC encoded sequence in accordance with a number of embodiments of the present disclosure.

FIG. 4 is a diagram illustrating an example CC encoded sequence in accordance with a number of embodiments of the present disclosure. The CC encoded sequence 460 is formed from the LDPC codeword by inserting a number of CC parity digits 469 therein, each CC codeword 468 is formed from a piece of the LDPC codeword 467 and associated CC parity digits 469. The LDPC codeword can include user data 462, LDPC parity digits 466, and/or optional BCH parity digits 464. Therefore, the CC encoded sequence 460 can include user data 462, user data digits 462, LDPC parity digits 466, optional BCH parity digits 464, and CC parity digits 469. As such, the CC encoded sequence 460 is a concatenated codeword. According to some embodiments, the CC encoded sequence 460 includes a number of CC codewords 468, and each CC codeword 468 is comprised of a piece of the LDPC codeword 467 and CC parity digits 469 associated with the piece of the LDPC codeword 467.

As an example, a CC encoded sequence 460 can be comprised of an LDPC codeword along with a number of CC parity digits 469. The LDPC codeword can have a size, for instance, of 16,000 digits, e.g., bits. Therefore, in this example, the CC encoded sequence 460 size is greater than 16,000 digits since the CC encoded sequence 460 includes a number of CC parity digits 469 in addition to the 16,000 digits of the LDPC codeword. LDPC code user data is comprised of the user data from the host in addition to the optional BCH code parity bits.

The CC encoded sequence 460 can be comprised of a number of CC codewords 468. FIG. 4 shows the CC encoded sequence 460 including 100 CC codewords 468. The piece of the LDPC codeword 467 of a CC codeword 468 can include a number of portions 470, e.g., "chunks." The CC parity digits 469 can be appended to the number of portions 470. FIG. 4 shows CC codeword 468 having 8 portions 470. That is, the piece of the LDPC codeword 467 of which the CC codeword is comprised, can include multiple portions.

Assuming the example LDPC codeword size is 16,000 digits, each portion 470 is therefore comprised of 20 digits, and each CC codeword 468 includes a piece of the LDPC codeword 467 having 8×20=160 digits plus CC parity digits 469 (the quantity depends on CC code rate) appended thereto. However, the piece of the LDPC codeword 467, CC codeword 468, CC parity digits 469, and/or portions 470 are not limited to the quantity of digits described in this example, and each may be comprised of more, or fewer, digits than described in this example. Each portion 470, e.g., 20 bits in the example, is a portion of the piece of the LDPC codeword 460, and each portion 470 is also a C1 codeword (discussed further below).

According to various embodiments of the present disclosure, the CC is a tensor product of an algebraic code ("C1") and a binary algebraic code ("C2"). C1 can be any detection code. According to various embodiments, C1 is comprised of a parity check code corresponding to each C1 codeword, e.g., a single-digit parity check code corresponding to each C1 codeword. For example, a C1 digit can be set to a "1" to indicate one of an even or odd parity for the digits of the C1 codeword. According to some embodiments, C1 can be computed as the least significant digit of an addition of all the digits of a portion 470. Assuming the piece of the LDPC codeword 467 of a CC codeword 468 includes 8 portions, with a C1 computed for each chunk, results in an 8 digit vector. As such, C1 can be used to detect an odd number of digit errors in a portion, e.g., a portion 470, of the piece of the LDPC codeword 467. Conversely, C1 cannot be used to detect an even number of digit errors in a portion of the piece of the LDPC codeword 460, e.g., in a portion 470.

C2 can be any correction code. For example, C2 can be a binary algebraic code such as a Hamming code. However, C2 is not limited to a Hamming code implementation. C2 can be used to identify "t" errors and detect "t+1" errors. That is, C2 can be used to directly identify "t" portions 470 of a CC codeword 468 that are in error, and can be used to detect that "t+1" portions 470 of a CC codeword 468 are in error (but cannot identify which portions 470 are in error). If there are more than "t+1" errors, the CC code cannot correctly detect the portions 470 that are in error. In this case, portions 470 can be mis-identified as being in error and/or not being in error. As a result, some bits may be assigned improper reliability values (as discussed further below).

The tensor product of C1 and C2 can be further illustrated by an example. Assume C1 is a rate 4/5 single parity code and the C2 is rate 4/7 Hamming code. Parity check matrices of C1, C2, and the tensor product of H(C1) and H(C2) are given as follows:

$$H(C1) = [1 1 1 1 1]$$

$$H(C2) = \begin{bmatrix} 1110100 \\ 1101010 \\ 1011001 \end{bmatrix}$$

$$H(TPC) = TP(H(C1), H(C2)]$$
$$= \begin{bmatrix} 11111-11111-11111-00000-11111-00000-00000 \\ 11111-11111-00000-11111-00000-11111-00000 \\ 11111-00000-11111-11111-00000-00000-11111 \end{bmatrix}$$

H(C1) is 1×5 matrix, H(C2) is 3×7 matrix, and the resultant H(TPC) is 3×35 matrix. Thus, the resultant code rate is 32/35.

To determine the tensor product, H(C1) is multiplied, e.g., by matrix multiplication, by each entry of H(C2). For instance, the first 5 entries of the first row of H(TPC) are computed by multiplying the H(C1) by H(C2)(1,1) which is a 1, for example. Similarly, the last 5 bits of the second row of H(TPC) are computed by multiplying H(C1) by H(C2) (2,7)=0, for example. The resultant code based on the tensor product of C1 (detection code) and C2 (correction code) is a "detection code."

The CC encoder, e.g., 350 in FIG. 3, generates a CC codeword 468, which is written to the memory, e.g., 339 in FIG. 3. The CC is a systematic code. Therefore, encoding involves generating the parity digits of the CC 469. This is a linear operation involving binary additions. Given that the CC is the innermost code, the input to the CC encoder, e.g., 350 in FIG. 3, is the LDPC codeword, e.g., LDPC encoded bit sequence. The CC encoder takes this input sequence and appends the CC parity digits thereto. The resultant CC codeword is then written to the memory, e.g., by a controller such as 238 shown in FIG. 2.

The following discussion is an example that illustrates generating the CC codeword. The code rate for this example is 32/35, so each 32 bits of data input to the CC encoder is mapped into a 35 bit CC codeword, which includes 3 parity digits. In the following example, the 32 bit input to the CC encoder is assumed as follows:

U=[U1 U2 ... U32]. Then the CC codeword (with the 3 parity digits of the CC appended) is of the form:

| U1 | U6  | U11 | U16 | U21 | U25 | U29 |
| U2 | U7  | U12 | U17 | U22 | U26 | U30 |
| U3 | U8  | U13 | U18 | U23 | U27 | U31 |
| U4 | U9  | U14 | U19 | U24 | U28 | U32 |
| U5 | U10 | U15 | U20 | P1  | P2  | P3  |
| S1 | S2  | S3  | S4  | S5  | S6  | S7  |

P1, P2, and P3 are the parity digits. The i-th "phantom syndrome" can be computed, for example, by adding up the 5 bits in the i-th column, e.g., using binary addition. The terms S1, S2, S3, and S4 can be computed as a number. The terms S5, S6, and S7 include P1, P2, and P3. The resultant syndrome (vector) [S1 S2 . . . S7] is a valid codeword for the 4/7 Hamming code that was used. By multiplying the phantom syndrome with the parity check matrix of the Hamming code S5, S6 and S7 can be determined from S1, S2, S3 and S4 as follows (all additions are binary):

S5=S1+S2+S3;
S6=S1+S2+S4;
S7=S1+S3+S4; and

Then S5, S6 and S7 can be used to get P1, P2 and P3 as follows:

P1=S5+U21+U22+U23+U24;
P2=S6+U25+U26+U27+U28;
P3=S7+U29+U30+U31+U32.

The syndrome (vector) [S1 S2 . . . S7] can be multiplied by the parity check matrix of C2, e.g., a Hamming code parity check matrix, which results in another syndrome that can be used to detect or identify portions 470 that are in error, as previously discussed.

Figure 5:
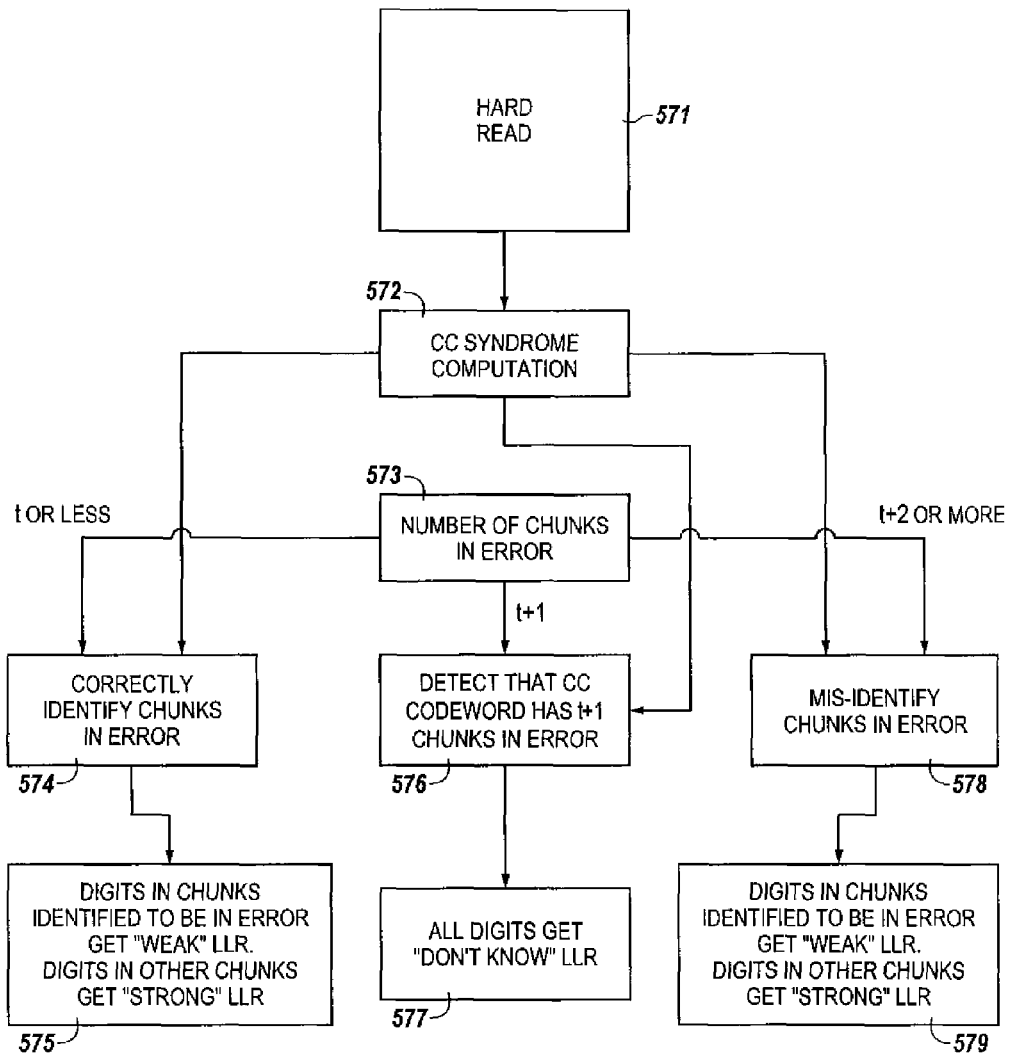
FIG. 5 is a flow chart of a method for decoding using classification codes in accordance with a number of embodiments of the present disclosure.

FIG. 5 is a flow chart of a method for decoding classification codes in accordance with a number of embodiments of the present disclosure. The input to CC decoder can be, for example, data read from a memory, such as by a hard read 571. The quantity of data read at one time can, for instance, correspond to a page of data. The CC decoder, e.g., 352 in FIG. 3, can operate on a CC codeword of a received CC encoded sequence, e.g., an LDPC codeword to include a number of CC codewords. The data comprising the CC encoded sequence can include multiple CC codewords. The exact number of CC codewords in a given LDPC codeword depends on CC and LDPC code codeword sizes In this example, for each CC codeword, the decoding steps are as follows. The CC syndrome is computed, as shown at 572, by multiplying the received CC codeword by the parity check matrix of the classification code. A number of portions may be in error, as shown at 573. Different results will occur depending on the quantity of portions that are in error. That is, results differ depending on whether there are t or less portions in error, there are t+1 portions in error, or whether there are more that t+1, e.g., t+2 or more, portions in error.

If "t" or less portions are in error in the received CC codeword, the syndrome correctly identifies portions that are in error, as indicated at 574. The portions identified to be in error will have odd number of bits in error when C1 is a single parity code. A reliability value corresponding to a weak reliability (with proper sign) is associated with all bits in the portions identified to be in error, and a reliability value corresponding to a strong reliability (with proper sign) is associated with all bits in the other portions, e.g., not identified as being in error, as indicated at 575. According to various embodiments of the present disclosure, the reliability value corresponding to the weak and/or strong reliability for a digit of a particular cell can be adjusted, e.g., refined, tuned, etc., based, at least partially on, condition of the particular memory cell, e.g., program/erase cycles, retention, the amount of time the data has been retained, the number of read disturbs, etc.

If "t+1" portions are in error, the syndrome detects that "t+1" portions are in error without identifying the portions that are in error, as indicated at 576. In this case, all bits in the CC codeword are assigned a reliability value corresponding to an uncertain reliability, as indicated at 577. According to various embodiments of the present disclosure, the reliability value corresponding to the uncertain reliability for a digit of a particular cell can be adjusted, e.g., refined, tuned, etc., based, at least partially on, condition of the particular memory cell, e.g., program/erase cycles, retention, the amount of time the data has been retained, the number of read disturbs, etc.

If more than "t+1" portions are in error, the syndrome mis-identifies portions in error, as indicated at 578. For the portions mis-identified to be in error, a reliability value corresponding to a weak reliability (with proper sign) is associated with all bits in the portions mis-identified to be in error, as indicated at 579, and a reliability value corresponding to a strong reliability (with proper sign) is associated with all bits in the other portions, e.g., not identified as being in error, as indicated at 579. This is treated the same as the case when there are "t" or less portions in error.

As a result of the mis-identification, some bits may be assigned improper reliabilities. A reliability value corresponding to a weak reliability is associated with bits in portions mis-identified to be in error. Ignoring undetectable error events in C1 (even number of bits in error), the reliability value corresponding to a weak reliability might be associated with bits that are actually correct, e.g., bits of the CC codeword. For the remaining portions, e.g., those portions not mis-identified as being in error, in some of these portions there will be odd number of bits in error and a reliability value corresponding to a strong reliability is associated with these erroneous bits, as well as the remaining correct bits.

Association of an incorrect and/or improper reliability value with some bits can cause some performance degradation, e.g., in the LDPC decoder. However, given that reliability value association does not change RBER, the performance degradation can be small, and thus tolerable in view of the benefits associated with using soft data in the LDPC decoder.

A detailed example of CC decoder operation is described below. After receiving the CC codeword stored in memory, e.g., via a hard read, a 1×7 phantom syndrome is computed. The 1×7 phantom syndrome is multiplied by the 3×7 H(C2) to obtain a 1×3 error location matrix, which can be converted into decimal to locate a portion that has an odd number of bit errors. As an example consider:
U=[01011 11111 00011 11000 1010 1111 0000]
C=[01011 11111 00011 11000 10100 11110 00001] (bit error indicated by a single underline and parity digits indicated by a double underline)
Assume a bit error exists in C(25), then C' is:
C'=[01011 11111 00011 11000 10100 01110 00001]. For this case the syndrome is [1100011], and the error locator is [010]=2, which points to the second 5 bit portion from the right. Given that C2 is capable of identifying t=1 portions in error and C' had a single portion in error, CC decoder correctly identified the portion that is in error.

As another example, for the same U and C, assume an error is made at U(7), U(8) and U(10), (3 bit errors in a single portion causes a single portion in error) so:
C'=[01011 10011 00011 11000 10100 11110 00001].
The syndrome is [1100001] and the error locator is [110]=6, which refers to the 6$^{th}$ portion from right.

For a final example, for 3 bit errors in portion 6 and 1 bit error in portion 2, then:
C'=[01011 10011 00011 11000 10100 01110 00001],
the syndrome is [1100011], and the error locator is [010]=2. So the error locator indicates the second portion has an odd number of bit errors. This particular CC code is capable of locating only one portion with odd number of bit errors. Since this example had 2 portions in error, it corresponds to 578 and 579 in FIG. 5. In this case CC decoder mis-identified portion 6 to be correct (not in error), that will result in associating high reliabilities in the erroneous bits of portion 6.

The selection and/or design of the classification code can be made based on the needs of the computing system and/or memory device to which the present apparatus or method is being implemented. The CC does not change RBER. The CC decoder associates soft data, e.g., reliability value, with the bits with the same sign as those read from the memory. All bits within a portion can be treated the same. For instance, if a portion is identified to be in error, a reliability value corresponding to a weak reliability can be associated with all bits in that portion even though only some, e.g., an odd number, of bits may be in error. Given this, it is better to have shorter portions. However, shorter portions use up more ECC overhead. For example, consider the following 2 example codes.

Code 1 has a C1 that is a 25 bit single parity code (K,N)=(24,25) and C2 that is a 1 bit correcting 2 bit detecting Hamming code (K,N)=(4,8). The CC is (K,N)=(196,200)_Rate=0.98 (2% overhead). Code 2 has a C1 that is a 10 bit single parity code (K,N)=(9,10) and a C2 that is a 1 bit correcting 2 bit detecting Hamming code (K,N)=(4,8). The CC is (K,N)=(76,80)_Rate=0.95 (5% overhead). These examples show the trade-off between smaller portion sizes (implying a finer soft reliability assignment) versus rate. Given a fixed ECC budget, any extra rate taken from the ECC budget can lead to using a higher rate LDPC code. Accordingly, the resultant RBER performance can be worse.

It can be beneficial to have a larger "t" for C2. However, the effect of this will be increased codeword size for the resultant code. Consider the following 2 example cases. Code 1 has a C1 that is a 25 bit single parity code (K,N)=(24,25) and a C2 that is a 1 bit correcting 2 bit detecting Hamming code (K,N)=(4,8). The CC is (K,N)=(196,200) Rate=0.98 (2% overhead). Code 2 has a C1 that is a 25 bit single parity code (K,N)=(24,25) and a C2 that is a 3 bit correcting 4 bit detecting Golay code (K,N)=(12,24). The CC is (K,N)=(588,600) Rate=0.98 (2% overhead). Both example codes have same overhead (2%). Code 1 can identify 1 portion in error and detect that 2 portions are in error per 200 bits (8 portions of 25 bits). Code 2 can identify 3 portions in error and detect that 4 portions are in error in 600 bits (24 portions of 25 bits). Comparing these two codes, Code 2 is pooling ECC resources and offering them in a larger codeword. Considering the 600 bit codeword of Code 2 as 3 sections of 200 bits, Code 2 will perform better only when one of the sections has 2, 3 or 4 portions in error and total number of portions in error among 24 portions is 4 or less. Simulations show that in an example RBER region ~5E-3, both codes perform similarly, which signifies that in the RBER region of interest, the probability of having more than 2 portions in error among 8 portions is very low. However, depending on the RBER region of interest for various products and technologies, pooling ECC resources of the CC codeword can be beneficial.

Given the potential of associating incorrect reliability values to bits of portions mis-identified as being in error, selection of the reliability values corresponding to weak reliability, uncertain reliability, and/or strong reliability can be used to achieve good performance. For the same configuration, a poorer selection can lead to much poorer results.

Referring again to FIG. 3, the feedback path 358 from the LDPC decoder 354 to the CC decoder 352 can be used to provide turbo equalization therebetween. Turbo equalization can potentially help the CC decoder 352 operations. The CC decoder 352 can first receive data via a hard read from the memory, and can generate soft data for use in the LDPC decoder 354. The LDPC decoder 354 can use this generated soft data for error correction, for example, after running a few iterations. Hard decisions from LDPC decoder 354 can be fed back to the CC decoder 352 via the feedback path 358. With the hard decisions from LDPC decoder 354, the CC decoder 352 can work with data from the hard read that potentially has less errors in it compared to data that is read from the memory 339.

Using this new data from LDPC decoder 354, the CC decoder 352 can re-generate the soft data and send it back to LDPC decoder 354. The feedback from LDPC decoder 354 can be ignored and the CC decoder can generate soft data as if no soft data exists (like the situation when the CC decoder 352 generated soft data based on the data obtained from memory 339 via a hard read). Or, the CC decoder 352 can identify portions that are potentially in error. By the CC decoder 352 identifying a portion that is in error instead of associating a reliability value with all bits corresponding to a same weak reliability, the CC decoder 352 can try to identify the bit(s) that are in error (using soft data fed back from LDPC decoder 354). For example, the lowest reliability bits can be identified as being more likely to be in error, and a reliability value corresponding to a weak reliability can be associated with some bits of a portion while a reliability value corresponding to a strong reliability can be associated with other bits within a chunk.

Decoding advanced error-correction codes (ECCs), such as low-density parity-check (LDPC) codes, can be accomplished using soft data such as log-likelihood ratio (LLR) information. Confidence about a binary data value decision can be expressed as an LLR, which is calculated as $$LLR = \log\left(\frac{P(0)}{P(1)}\right),$$

where P(0) is a conditional probability that a digit of a data value, e.g., a bit, has a first value, e.g., zero, and P(1) is a conditional probability that a digit of a data value has a second value, e.g., one. (Note that if codewords are stored in memory, the data value actually stored in memory is that of the codeword.) When full confidence is attributed to a sensed state the above formula results in positive infinity when a state representing a '0' is sensed since $$LLR = \log\left(\frac{1}{0}\right) = \log(\infty) = \infty,$$

and negative infinity when a state representing a "1" is sensed since $$LLR = \log\left(\frac{0}{1}\right) = \log(0) = -\infty.$$

The measure of confidence can be truncated to one bit, returning +1 in place of positive infinity and returning −1 in place of negative infinity responsive to a read request, for example.

One example method can include determining, using a hard read, a state of a memory cell. Soft data is determined based, at least partially, on the determined state. According to a number of embodiments of the present disclosure, probabilities can be pre-determined for each digit of a data value, e.g., bit, corresponding to each state in a particular data value arrangement based on the data values corresponding to neighboring states in the particular data value arrangement. From these pre-determined probabilities, LLRs can also be computed for each digit of a data value, e.g., bit, corresponding to each state in a particular data value arrangement based on the data values corresponding to neighboring states in the particular data value arrangement. The data value probabilities and/or LLRs can be stored in a data structure, such as a look-up table (LUT). Thereafter, appropriate data value probabilities and/or LLRs can be retrieved from the LUT based on, e.g., indexed by, a hard read.

As discussed previously with respect to FIG. 5, if "t+1" portions are in error, e.g., by the CC decoder 352 shown in FIG. 3, the syndrome detects that "t+1" portions are in error without identifying the portions that are in error, as indicated at 576. According to some embodiments of the present disclosure, all digits, e.g., bits, in the CC codeword are assigned a same reliability value corresponding to an uncertain reliability, as indicated at 577. According to various embodiments of the present disclosure, for particular bits in the CC codeword having t+1" portions identified as being in error, the same reliability value corresponding to an uncertain reliability can be adjusted respectively, e.g., refined, based, at least partially, on soft data determined for particular digits in the CC codeword having "t+1" portions identified to be in error. The soft data determined for particular digits in the CC codeword having "t+1" portions identified to be in error can be, for example, an LLR determined using a hard read of the particular digit or an LLR determined from multiple reads of the particular digit.

As discussed previously with respect to FIG. 5, if "t" or less portions are in error in the received CC codeword, the syndrome correctly identifies portions that are in error, as indicated at 574. A reliability value corresponding to a weak reliability (with proper sign) is associated with all bits in the portions identified to be in error, and a reliability value corresponding to a strong reliability (with proper sign) is associated with all bits in the other portions, e.g., not identified as being in error, as indicated at 575. According to various embodiments of the present disclosure, for particular bits in the CC codeword having "t" or less portions identified as being in error, the associated reliability value of a particular digit can be adjusted, e.g., refined, based, at least partially, on soft data determined for the particular digit in the CC codeword. The soft data determined for particular digit in the CC codeword can be, for example, an LLR determined using a hard read of the particular digit or an LLR determined from multiple reads of the particular digit.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:
1. An apparatus, comprising:
a classification code (CC) decoder; and
an outer code decoder coupled to the CC decoder,
wherein the CC decoder is configured to:
receive a CC codeword, the CC codeword including a piece of an outer code codeword and a corresponding CC parity digits; and determine soft data associated with the piece of outer code codeword, at least partially, by using the corresponding CC parity digits to associate a reliability value with at least a piece of the outer code codeword.

2. The apparatus of claim 1, wherein the outer code decoder is a soft input decoder.

3. The apparatus of claim 1, wherein the outer code decoder is an iterative decoder.

4. The apparatus of claim 3, wherein the iterative decoder is a low-density parity-check (LDPC) decoder, and the piece of the outer code codeword is piece of an LDPC codeword.

5. The apparatus of claim 1, further comprising a memory coupled to the CC decoder, and wherein the CC decoder is configured to receive the CC codeword via a hard read of the memory.

6. The apparatus of claim 1, wherein the reliability value includes a log-likelihood ratio (LLR) determined, at least partially, for digits of the CC codeword determined using a hard read.

7. The apparatus of claim 1, wherein the soft data is a reliability value associated with a portion of the piece of the outer code codeword.

8. The apparatus of claim 7, wherein the CC decoder is configured to associate a respective reliability value with each digit of the portion of the piece of the outer code codeword.

9. The apparatus of claim 7, wherein the CC decoder is configured to provide the reliability value for the portion of the piece of the outer code codeword to the outer code decoder.

10. The apparatus of claim 9, wherein outer code decoder is configured to utilize the reliability value in decoding the outer code codeword.

11. The apparatus of claim 10, wherein the reliability value is one of three values, a respective value corresponding to one of uncertain reliability, strong reliability, or weak reliability.

12. The apparatus of claim 7, further comprising adjusting the reliability value based, at least partially, on a condition of a memory cell.

13. The apparatus of claim 1, wherein the CC is a tensor product of two algebraic codes.

14. The apparatus of claim 1, wherein the CC is a tensor product of a single-digit parity check code and a binary algebraic code.

15. The apparatus of claim 1, wherein the CC decoder and the outer code decoder are components of a controller.

16. The apparatus of claim 1, wherein outer code decoder is configured to feedback hard decisions to the CC decoder via a feedback path, and the CC decoder is configured to determine soft data using the hard decisions.

17. An apparatus, comprising:
an outer code decoder;
an intermediate code decoder coupled to the outer code decoder; and
a classification code (CC) decoder coupled to the intermediate code decoder,
wherein the CC decoder is configured to:
receive a CC codeword from a memory via a hard read, the CC codeword comprising CC parity digits and data that is composed of user data from the host and intermediate code parity digits and outer code parity digits;
determine soft data associated with the data by using the CC parity digits to associate a reliability value with at least a piece of the data; and
provide the data and the soft data to the intermediate code decoder.

18. The apparatus of claim 17, wherein the data is a piece of a low-density parity-check (LDPC) codeword, and the intermediate code decoder is an iterative LDPC decoder.

19. The apparatus of claim 17, wherein the CC decoder is further configured to determine soft data associated with a number of digits of the data based, at least in part, on the CC parity digits.

20. The apparatus of claim 17, wherein the CC is a tensor product of a detection code and a correction code.

21. The apparatus of claim 17, wherein the CC is a tensor product of a single-digit parity check code (C1) and a binary algebraic code (C2).

22. The apparatus of claim 21, wherein the CC decoder is configured to detect an odd number of errors in at least a portion of the data using the C1.

23. The apparatus of claim 21, wherein the CC decoder is configured to identify t or fewer portions of the data in error using C2.

24. The apparatus of claim 21, wherein the CC decoder is configured to detect that t+1 portions of the data are in error without identifying which particular t+1 portions of the data that are in error.

25. The apparatus of claim 17, wherein the intermediate code decoder is configured to operate for at most 2 iterations.

26. The apparatus of claim 17, wherein the intermediate code decoder, the outer code decoder, and the CC decoder are components of a controller.

27. A method, comprising:
receiving, to a first decoder, a first encoder codeword, the first encoder codeword including a piece of a second encoder codeword and first code parity digits;
determining, via the first decoder, soft data associated with the piece of the second encoder codeword based, at least partially, on the first code parity digits by associating a reliability value with at least a piece of the second encoder codeword; and
providing the piece of the second encoder codeword and determined soft data from the first decoder to a second decoder.

28. The method of claim 27, wherein the second decoder is an iterative decoder.

29. The method of claim 28, further comprising determining, via the second decoder operating for at most two iterations, data based, at least partially, on the piece of the second encoder codeword and the determined soft data.

30. The method of claim 27, wherein determining the soft data includes determining a reliability value associated with a digit of the piece of the second encoder codeword.

31. The method of claim 27, further comprising determining, via the first decoder, a parity check code (C1) and a binary algebraic code (C2) from the first code parity digits, wherein the first code parity digits are computed from tensor product of C1 and C2.

32. The method of claim 27, wherein the first decoder is a classification code (CC) decoder, the first code parity digits are CC parity digits, the second decoder is a low-density parity-check (LDPC) decoder, and the piece of the second encoder codeword is a piece of an LDPC codeword.

33. The method of claim 27, wherein:
receiving the first encoder codeword to the first decoder includes:
receiving, to a classification code (CC) decoder, a CC codeword; and
wherein determining soft data via the first decoder includes:
determining, via the CC decoder, CC parity digits and a piece of an outer codeword from the CC codeword;

the method further comprising:
identifying t portions of the piece of the outer codeword in error based on the CC parity digits where there is t or fewer portions of the piece of the outer codeword in error; and
detecting t+1 portions of the piece of the outer codeword in error based on the CC parity digits where there is t+1 portions of the piece of the outer codeword in error.

34. The method of claim 33, further comprising providing, by the CC decoder, pieces of the outer codeword and soft data regarding identified and detected portions of the piece of the outer codeword to an iterative decoder, wherein the iterative decoder is a low-density parity-check (LDPC) decoder, and the pieces of the outer codeword is an LDPC codeword.

35. The method of claim 34, wherein identifying t portions of the outer codeword in error includes associating a reliability value corresponding to a weak reliability to all digits in the identified t portions of the outer codeword.

36. The method of claim 34, wherein identifying t portions of the piece of the outer codeword in error includes associating a reliability value corresponding to a strong reliability to all digits in other than the identified t portions of the piece of the outer codeword.

37. The method of claim 34, wherein identifying detecting t+1 portions of the outer codeword in error includes associating a reliability value corresponding to an uncertain reliability to all digits in the piece of the outer codeword.

38. The method of claim 33, further comprising:
determining a reliability value corresponding to a particular digit in the piece of the outer codeword based, at least partially, on the CC parity digits; and
adjusting the reliability value corresponding to the particular digit in the piece of the outer codeword based, at least partially, on soft data determined from reading the particular digit in the piece of the outer codeword.

39. The method of claim 38, wherein the soft data determined for the particular digit in the piece of the outer codeword is an LLR determined using a hard read for the particular digit in the piece of the outer codeword.

40. The method of claim 33, wherein determining the CC parity digits include computing a CC syndrome as the product of the received CC codeword and a parity check matrix of the CC parity digits.

41. The method of claim 33, wherein the received CC codeword is obtained from a memory via a hard read.

\* \* \* \* \*